United States Patent [19]

Ariizumi

[11] 4,413,403
[45] Nov. 8, 1983

[54] METHOD OF PRODUCING SEMICONDUCTOR DEVICES

[75] Inventor: Shoji Ariizumi, Tokyo, Japan

[73] Assignee: Tokyo Shibaura Denki Kabushiki Kaisha, Japan

[21] Appl. No.: 351,407

[22] Filed: Feb. 23, 1982

Related U.S. Application Data

[62] Division of Ser. No. 87,813, Oct. 24, 1979, abandoned.

[30] Foreign Application Priority Data

Oct. 31, 1978 [JP] Japan ............................... 53-134246

[51] Int. Cl.³ .......................................... H01L 21/22
[52] U.S. Cl. ...................................... 29/571; 29/578; 29/591; 148/187
[58] Field of Search .......................... 29/571, 578, 591; 148/187

[56] References Cited

U.S. PATENT DOCUMENTS

| 4,072,545 | 2/1978 | De La Moneda | 148/187 |
| 4,180,826 | 12/1979 | Shappir | 29/571 X |
| 4,231,051 | 10/1980 | Custode et al. | 29/589 X |
| 4,253,229 | 3/1981 | Yeh et al. | 29/580 X |
| 4,282,647 | 8/1981 | Richman | 148/187 X |

Primary Examiner—George T. Ozaki
Attorney, Agent, or Firm—Finnegan, Henderson, Farabow, Garrett & Dunner

[57] ABSTRACT

Disclosed is a method of producing semiconductor devices, comprising forming a laminate of a lower poly-Si film and an upper silicon nitride film on the substrate surface in a manner to provide a pattern of electrodes and wiring layer, removing the patterned silicon nitride film except the region in which a conductive layer is brought into contact with the underneath poly-Si film later, subjecting the substrate surface region to thermal oxidation so as to form a silicon oxide film covering the exposed surface of the substrate and the exposed surface of the poly-Si film, and removing the remaining silicon nitride film.

3 Claims, 19 Drawing Figures

F I G. 9
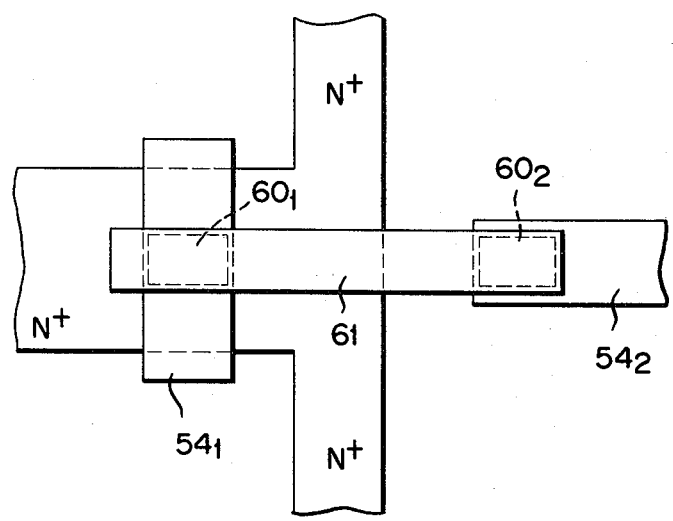

METHOD OF PRODUCING SEMICONDUCTOR DEVICES

This is a division of application Ser. No. 087,813, filed Oct. 24, 1979, now abandoned.

BACKGROUND OF THE INVENTION

This invention relates to a method of producing semiconductor devices, particularly, to improvements in the method of forming the electrodes and wiring layers of semiconductor devices.

It is a matter of serious concern in this field to enhance the integration degree of semiconductor elements. However, the construction of conventional semiconductor devices leaves room for further improvements in the integration degree as described in the following with reference to FIGS. 1 to 4. Specifically, each of FIGS. 1 and 3 is a plan view showing the construction of a conventional MOS type field effect transistor. FIG. 2 is a cross sectional view along line II—II of FIG. 1 and FIG. 4 shows the cross section along line IV—IV of FIG. 3.

As shown in FIGS. 1 and 2, a conventional MOS type field effect transistor comprises, for example, a silicon substrate 3 and an insulation film 4, e.g. silicon oxide film, formed on the surface of the substrate 3. Further, a diffusion layer 1 acting as the source or drain region of the transistor is formed in the substrate 3. In general, a contact hole 5 is formed in the insulation film 4 for providing an electrode 2 consisting of, for example, aluminum in direct contact with the diffusion layer 1. Incidentally, reference numeral 6 shown in FIG. 2 denotes a gate oxide film of the transistor. It is seen that a gate electrode 7 consisting of, for example, polycrystalline silicon, hereinafter referred to as "poly-Si," is formed on the gate oxide film 6. Further, a field oxide film 8 is formed as shown in the drawing.

In the conventional MOS type field effect transistor shown in FIGS. 1 and 2, the area required for forming a single contact hole is determined by $(a+b+c) \times W$, where "a" is the distance between the mutually facing edges of gate electrode 7 and the contact hole 5, "b" is the distance between the mutually facing edges of the contact hole 5 and the field oxide film 8, "c" is the width of the contact hole 5, and "W" is the gate width. In general, the insulation film 4 is formed relatively thick, e.g., about 5000 Å to 1μ thick. It follows that the wall of the insulation film 4 defining the contact hole 5 is inclined as shown in FIG. 2, leading to increases in distances "a" and "b" mentioned above. Further, it is difficult to make the contact hole 5 sufficiently small, namely, distance "c" mentioned above is inevitably made large. In other words, the conventional transistor necessitates a large area for forming a contact hole, resulting in that it is difficult to enhance the integration degree of semiconductor elements in the production of an IC, an LSI, etc.

FIGS. 3 and 4 collectively show another kind of conventional MOS type field effect transistor. In this case, a first poly-Si layer consisting of a gate 10 and a wiring layer 11 is covered with an insulation film 12 such as a silicon oxide film. As shown in the drawing, the insulation film 12 is provided with a contact hole 13 and, then, a second poly-Si layer 14 acting as a conductive layer is formed on the insulation film 12 so as to bring the second poly-Si layer 14 into direct contact with the first poly-Si layer, i.e., the gate 10 and the wiring layer 11. Alternatively, the first insulation film covering the first poly-Si layer is covered with a second poly-Si layer and, then, with a second insulation film, followed by providing the first and second insulation films with contact holes. In this case, a metal wiring layer is formed in a manner to fill the contact holes, thereby connecting the first and second poly-Si layers. In such arts, however, the first poly-Si layer should be formed in a manner to provide a sufficient room against deviation in the step of mask-aligning to form the contact hole 13. In addition, it is substantially impossible to provide the contact hole 13 above the gate 10 in view of the required room making up for the mask deviation mentioned above. As a result, it was customary to provide a contact hole above a field oxide film for connecting a conductive layer to the gate 10 as shown in FIG. 4.

To reiterate, the conventional method necessitates a large area for forming a contact hole. In addition, the required area is further enlarged for avoiding the gate-conductive layer connection above the gate.

SUMMARY OF THE INVENTION

An object of this invention is to provide a method of producing a semiconductor device which does not comprise forming a contact hole for effecting the connection between wiring layers or between a wiring layer and an electrode (referred to as holeless contact process) as well as a semiconductor device produced by this method. The method of this invention permits markedly decreasing the area required for effecting the connection mentioned above, rendering it possible to enhance prominently the integration degree of the semiconductor elements.

According to this invention, there is provided a method of producing a semiconductor device, comprising the steps of:
  forming a poly-Si film on one main surface of a silicon semiconductor substrate;
  forming a silicon nitride film on the poly-Si film;
  removing the silicon nitride film except the pattern in which a contact-forming portion of at least one of a source and a drain if formed later;
  selectively removing the poly-Si film in a manner to form a pattern of at least one of a source electrode and a drain electrode;
  oxidizing the substrate surface so as to form an oxide film covering the exposed portion of the substrate and exposed portion of the poly-Si film;
  removing the silicon nitride film remaining on the poly-Si film; and
  forming a conductive layer in contact with the exposed surface of the poly-Si film.

The method according to another embodiment of this invention essentially comprises the steps of:
  (1) forming a poly-Si film on one main surface of a silicon semiconductor substrate;
  (2) forming a silicon nitride film on the poly-Si film;
  (3) selectively removing the silicon nitride and poly-Si films in a manner to form a pattern of the electrodes and wiring layer;
  (4) removing the patterned silicon nitride film except the contact-forming portion in which a conductive layer is brought into contact with the underneath poly-Si film layer;
  (5) oxidizing the substrate surface so as to form an oxide film covering the exposed surface of the substrate and the exposed surface of the poly-Si film;

(6) removing the silicon nitride film remaining on the poly-Si film; and (7) forming the conductive film in direct contact with the exposed surface of the poly-Si film.

The conductive film mentioned above consists of poly-Si, molybdenum silicide or a metal such as aluminum.

In the prior art, the wall of the insulation film defining a contact hole is inclined as described previously. In addition, the prior art is accompanied by deviation of mask-aligning to form a contact hole. However, the method of the present invention is free from these difficulties. Specifically, the method of this invention quite differs from the prior art in the manner of bringing a conductive layer into contact with a contact-forming portion of the poly-Si film constituting the electrode and wiring layer of the device. In this invention, the silicon nitride film positioned on the contact-forming portion is left unremoved and the semiconductor substrate is oxidized so as to form an oxide film convering the exposed surfaces of the substrate and poly-Si film. Then, the remaining silicon nitride film is removed so as to expose the poly-Si film positioned beneath the nitride film. Naturally, a conductive layer formed later is brought into contact with the exposed surface of the poly-Si film (contact-forming portion). Clearly, the method of this invention permits markedly decreasing the required area of a contact portion compared with the prior art.

In this invention, the poly-Si film should preferably be about 5000 Å thick and the oxide film formed by thermal oxidation of the substrate surface should preferably be at least 2000 Å thick. Further, a thin silicon oxide film may be formed between the poly-Si film and the silicon nitride film for absorbing the difference in thermal expansion coefficient between the poly-Si film and the nitride film. The poly-Si film, silicon nitride film and silicon oxide film may be formed and selectively removed by ordinary methods.

BRIEF DESCRIPTION OF THE DRAWINGS

FIGS. 5-1 to 5-6 are cross sectional views collectively showing how to produce a MOS type field effect transistor according to one embodiment of this invention;

FIG. 6 is a plan view showing the electrode portion of a MOS type field effect transistor produced according to one embodiment of this invention;

FIGS. 8-1 to 8-6 are cross sectional views collectively showing how to produce a MOS type field effect transistor according to another embodiment of this invention; and FIG. 9 is a plan view of the MOS type field effect transistor produced by the method shown in FIGS. 8-1 to 8-6.

DETAILED DESCRIPTION OF THE PREFERRED EMBODIMENTS

Figure 1:
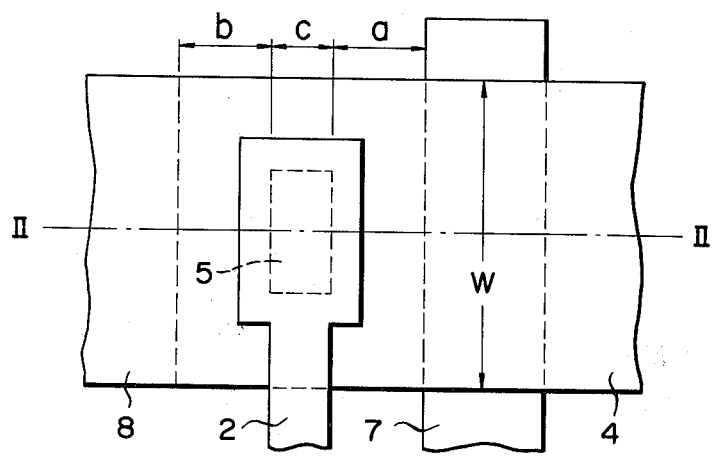
FIG. 1 is a plan view showing the electrode portion of a conventional MOS type field effect transistor.
Figure 2:
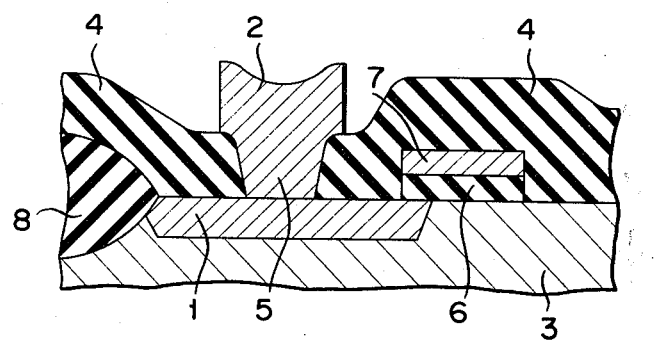
FIG. 2 is a cross sectional view along line II—II of FIG. 1.
Figures 1, 5:
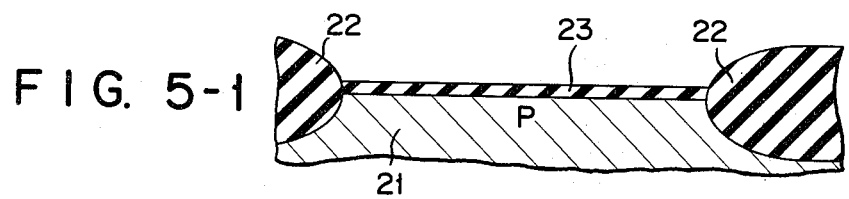
Figures 2, 5:
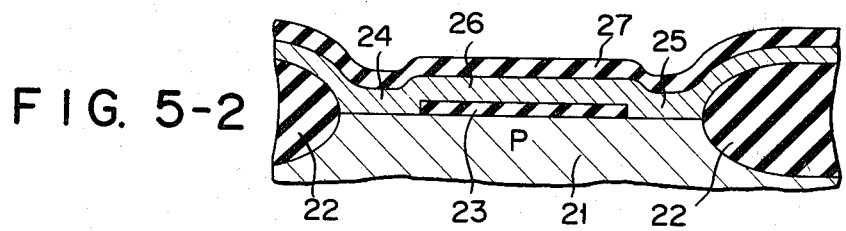
Figures 3, 5:
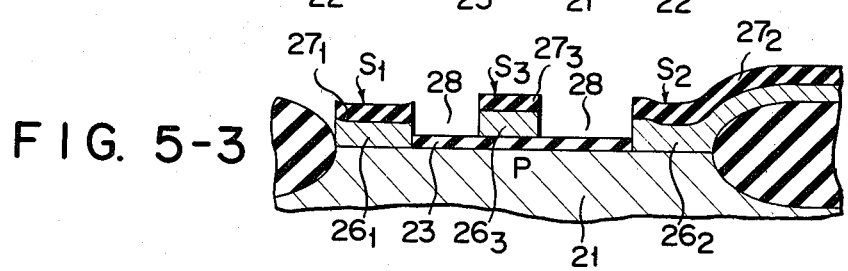
Figures 4, 5:
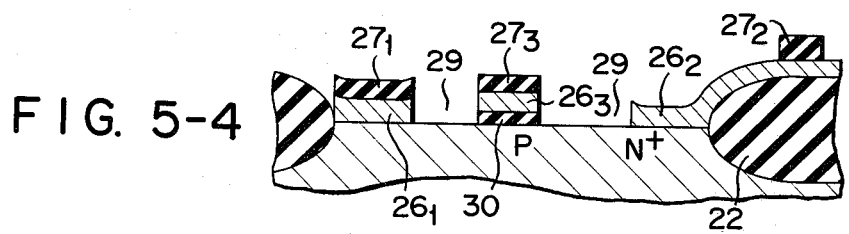
Figure 5:
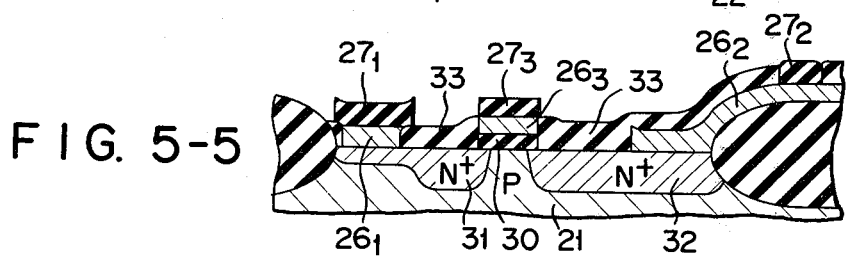
Figures 5, 6:
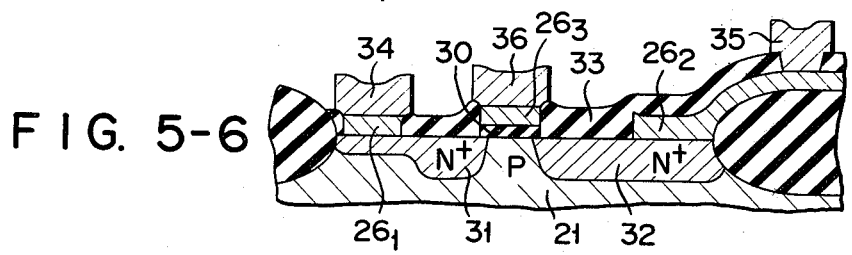
Figure 6:
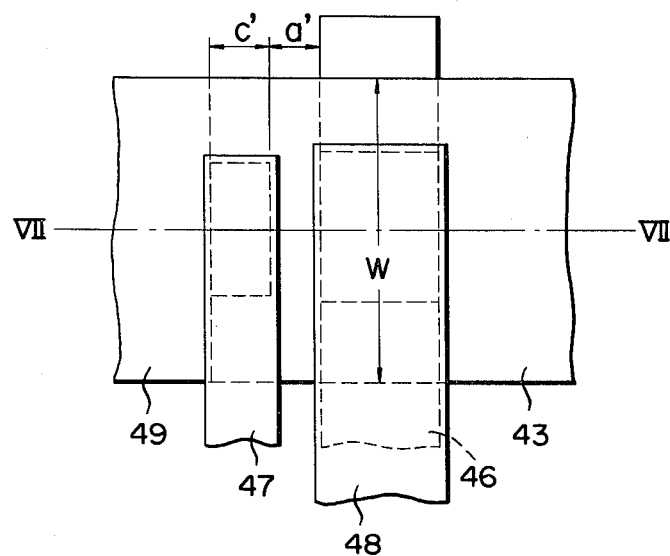

FIGS. 5-1 to 5-6 collectively show how to produce a MOS type field effect transistor according to one embodiment of this invention. In this first step, a field oxide film 22 is selectively formed on one main surface of a silicon semiconductor substrate 21 of one conductivity type, e.g., P-type, followed by forming a silicon oxide film 23 having a thickness of 500 to 1500 Å in the region surrounded by the field oxide film 22 as shown in FIG. 5-1. The silicon oxide film 23 is selectively removed by PEP (Photo Engraving Process) and Etching method so as to form contact holes 24, 25, followed by forming a poly-Si film 26 and a silicon nitride film 27 on the entire surface of the substrate 21 as shown in FIG. 5-2. Ordinary methods such as chemical vapor deposition may be employed for forming these films 26, 27. The poly-Si film 26 is doped with an impurity of, for example, N-type which is opposite to the conductivity type of the substrate. It is possible to diffuse an impurity into an undoped poly-Si film formed in advance so as to provide the doped poly-Si film.

Figure 3:
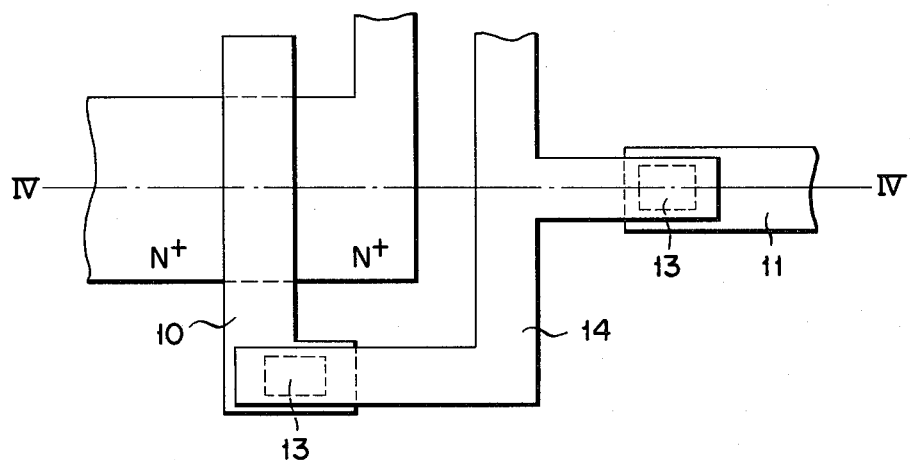
FIG. 3 is a plan view showing the electrode and wiring portions of a conventional MOS type field effect transistor.

Then, the silicon nitride film 27 and the poly-Si film 26 are successively removed selectively by Photo Engraving Process and Etching method, etc. in a manner to provide a pattern of the electrode and wiring layer as shown in FIG. 5-3. It is seen that the contact holes 24, 25 formed previously are filled with laminates $S_1$, $S_2$, respectively, such that the patterned underneath poly-Si layers $26_1$, $26_2$ of the laminates are in direct contact with the substrate 21. Further, a laminate $S_3$ is formed on a part of the silicon oxide film 23 such that the patterned underneath poly-Si layer $26_3$ is in direct contact with the silicon oxide film 23. Still further, openings 28, 28 are formed on both sides of the laminate $S_3$.

Figure 4:
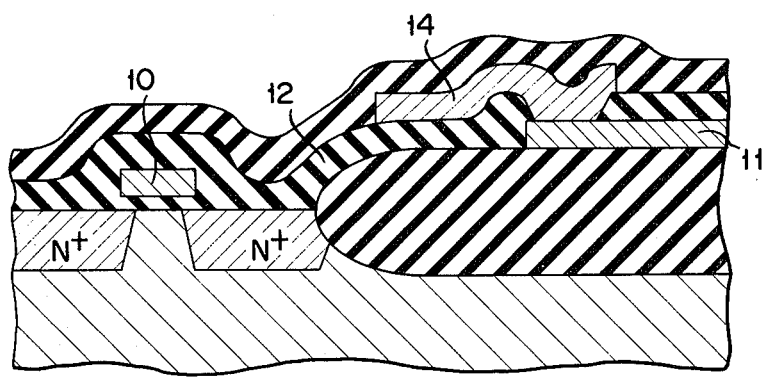
FIG. 4 is a cross sectional view along line IV—IV of FIG. 3.

The remaining silicon nitride film is further removed selectively as shown in FIG. 5-4. It is seen that silicon nitride films $27_1$, $27_3$ constituting the upper layers of the laminates $S_1$, $S_3$, respectively, and a silicon nitride film $27_2$ positioned above the field oxide film 22 are left unremoved. Incidentally, the remaining silicon nitride films are removed later and the resultant contact-forming portions are filled with a conductive layer. It follows that the shapes and sizes of the silicon nitride films $27_1$, $27_2$, $27_3$ which are left unremoved in this step should be controlled in accordance with the shapes and sizes of the contact-forming portion mentioned above. After the selective removal of the silicon nitride film, the silicon oxide film 23 exposed by the openings 28, 28 is removed for forming openings 29, 29 selectively exposing the surface of the substrate 21 (see FIG. 5-4). The unremoved portion of the silicon oxide film 23 constitutes a gate oxide film 30. Of course, the selective removal of the silicon oxide film 23 may be carried out before the selective removal of the silicon nitride film.

An impurity of a conductivity type opposite to that of the substrate 21 is diffused through the openings 29, 29 into the substrate by an ordinary diffusion technique or ion implanation technique so as to form a source region 31 and a drain region 32 as shown in FIG. 5-5. It is important to note that the poly-Si film $26_2$ is exposed in the diffusion step unlike the poly-Si films $26_1$ and $26_3$ which are covered with the silicon nitride films $27_1$ and $27_3$ as seen from FIG. 5-4. It follows that the impurity is diffused into the substrate through the poly-Si film $26_2$ as well (see the drain region 32 of FIG. 5-5). Further, the impurity doped in the poly-Si film $26_1$ is also diffused into the substrate by the heat in the diffusion step, etc. However, the impurity doped in the poly-Si film $26_3$ is not diffused into the substrate because the gate oxide film 30 is disposed between the substrate surface and the poly-Si film $26_3$.

After the impurity diffusion, the substrate surface is oxidized so as to form a silicon oxide film 33 covering the exposed surface of the substrate and the exposed surface of the poly-Si film $26_2$ as shown in FIG. 5-5. Naturally, the silicon oxide film 33 also covers the exposed side faces of the poly-Si films $26_1$ and $26_3$. The oxidation is carried out at about 1000° to 1100° C. under an atmosphere of dry oxygen, wet oxygen or steam, thereby forming a silicon oxide film having a thickness of at least about 2000Å. Needless to say, a silicon oxide film is hardly formed on the surfaces of the silicon nitride films $27_1$, $27_2$, $27_3$.

Finally, the silicon nitride films $27_1$, $27_2$, $27_3$ are removed so as to expose the surfaces of the poly-Si films $26_1$, $26_2$, $26_3$ and, then electrodes 34, 35, 36 and a wiring layer consisting of, for example, aluminum or poly-Si are formed by an ordinary method in direct contact with the exposed surfaces of the poly-Si films via the contact-forming portions as shown in FIG. 5-6, thereby obtaining a desired product of a field effect transistor.

Figure 7:
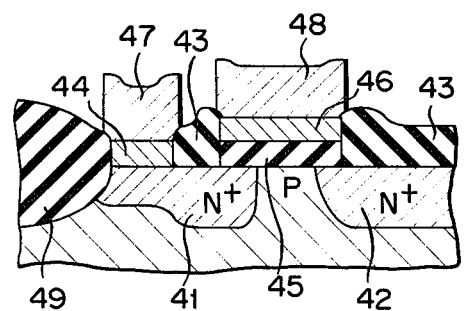
FIG. 7 is a cross sectional view along line VII—VII of FIG. 6.

FIGS. 6 and 7 are intended to explain the merit of of field effect transistor produced by the method of this invention. It is seen that a source or drain region 41 is connected to an electrode 47 via an intermediate contact layer of a poly-Si film 44. It is important to note that the side wall of a silicon oxide film 43 surrounding the intermediate contact layer of the poly-Si film 44 is substantially perpendicular to the substrate surface. It follows that the distance (a') between the mutually facing edges of the poly-Si film 44 and a poly-Si film 46 formed on a gate oxide film 45 is markedly smaller than the corresponding distance (a) (see FIG. 1) of the conventional device. It should also be noted that the poly-Si film 44 is formed in close proximity to a field oxide film 49. In other words, the distance (b') between the mutually facing edges of the poly-Si film 44 and the field oxide film 49 is substantially zero. Further, the method of this invention permits making the width (c') of the intermediate contact layer of the poly-Si film 44 much smaller than the width (c) for the conventional device. To be brief, the relationship of (a>a', b'=0, c>c') is established, leading to a marked reduction in the area required for forming a single electrode. Specifically, the values of a=4μ, b=3μ and c=6μ for the conventional device were reduced to a'=3μ, b'=0, and c'=4μ in this invention. Since the gate width W was 20μ for each of the prior art and this invention, the area in question was 140μ$^2$ in this invention in contrast to 260μ$^2$ for the prior art, i.e., this invention achieved about 46% reduction in the area required for forming a single electrode. Clearly, the method of the invention permits markedly enhancing the integration degree of semiconductor elements.

It should also be noted that the poly-Si films $26_1$ and $26_2$ are disposed between the electrode 34 and the source region 31 and between the electrode 35 and the drain region 32, respectively, as shown in FIG. 5-6. The particular construction is effective for preventing the electrode metal, e.g., aluminum, from spiking the source or drain region so as to form an alloy. Incidentally, the alloying is a difficulty accompanying a conventional N-channel MOS type field effect transistor.

Further, it is unnecessary in this invention to use a mask in the step of forming the contact-forming portion exposing the poly-Si film, i.e., self-alignment. In contrast, a contact hole is formed in an insulation layer by using a mask in the prior art for mounting an electrode to the diffusion layer.

An additional merit of this invention is that it is possible to mount the electrode 48 directly to the poly-Si film 46 in the gate region by self-alignment technique as shown in FIGS. 6 and 7. In the prior art, however, it is substantially impossible to mount the electrode or wiring layer in direct contact with the poly-Si film included in the gate region of the field effect transistor as shown in FIGS. 3 and 4. It follows that the method of this invention is markedly advantageous over the prior art in integration degree of semiconductor elements. In addition, the invented method permits prominently enhancing the degree of freedom in pattern and layout of the device. It should also be noted that a contact-forming portion is provided by simply removing the silicon nitride film remaining on the poly-Si film in the gate region, leading to a high reliability of the produced semiconductor device.

In the embodiment described above, the gate electrode 36 is formed on the poly-Si film $26_3$ as shown in FIG. 5-6. However, it is possible to mount an aluminum gate electrode in direct contact with the gate oxide film 30. In this case, the gate electrode is brought into contact with a wiring layer in a region other than the gate oxide film 30.

Figures 1, 8:
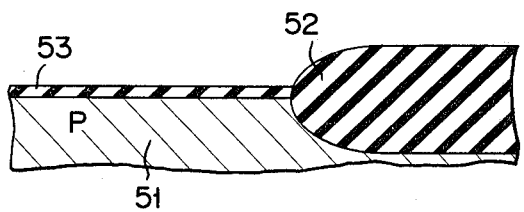
Figures 2, 8:
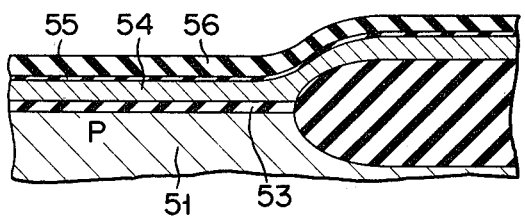
Figures 3, 8:
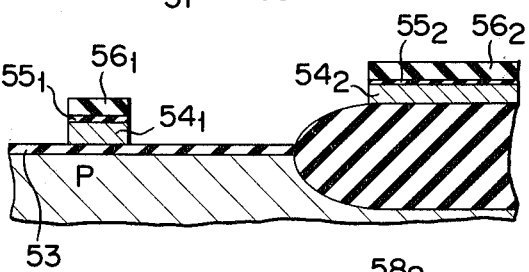
Figures 4, 8:
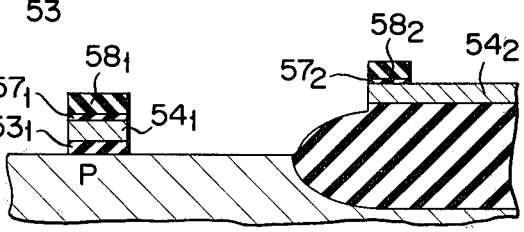
Figures 5, 8:
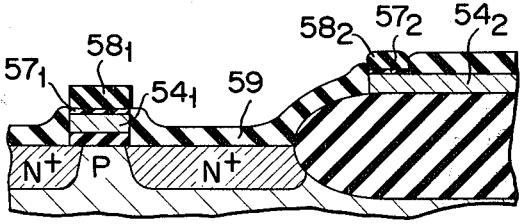
Figures 6, 8:
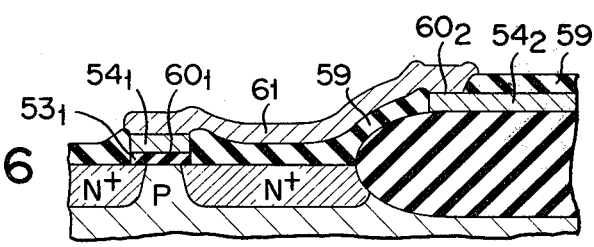

FIGS. 8-1 to 8-6 collectively show how to produce a MOS type field effect transistor according to another embodiment of this invention. In this embodiment, the transistor comprises a double wiring layers formed of poly-Si.

In the first step, a field oxide film 52 about 1μ thick is formed selectively on one main surface of a silicon semiconductor substrate 51 of one conductivity type, e.g., P-type, followed by forming a silicon oxide film 53 about 500 to 1500Å thick in the region surrounded by the field oxide film 52 as shown in FIG. 8-1. Although a buried contact is formed by an ordinary method after forming the silicon oxide film 53, the buried contact is not shown in the drawing. Then, a poly-Si film 54, a thin silicon oxide film 55 and a silicon nitride film 56 are formed successively on the entire surface of the substrate 51 as shown in FIG. 8-2. Incidentally, it is of course possible to omit the thin silicon oxide film 55 disposed between the poly-Si film 54 and the silicon nitride film 56. It should also be noted that the poly-Si film 54 is doped with an impurity equal to that diffused later into the substrate for forming the source and drain regions. Of course, different impurities can be used as far as the conductivity type thereof is the same.

The silicon nitride film 56, the silicon oxide film 55 and the poly-Si film 54 are selectively removed successively by Photo Engraving Process and Etching method as shown in FIG. 8-3. It is seen that a patterned laminate consisting of a poly-Si film $54_1$, a silicon oxide film $55_1$ and a silicon nitride film $56_1$ remains on the silicon oxide film 53 and another laminate consisting of a poly-Si film $54_2$, a silicon oxide film $55_2$ and a silicon nitride film $56_2$ on the field oxide film. Then, the silicon nitride films and the silicon oxide films included in the above-noted laminates as well as the silicon oxide film 53 in contact with the substrate 51 are selectively removed as shown in FIG. 8-4. Specifically, the silicon nitride films are removed first except a contact-forming portion in which a second poly-Si film is formed later, namely, the remaining portions of the silicon nitride films are removed later for forming therein the second poly-Si film. It should be noted that the silicon nitride film $56_1$ shown in FIG. 8-3 is also removed selectively in this step, though the removed portion can not be recognized in FIG. 8-4 because FIGS. 8-1 to 8-6 are cross sectional views. Likewise, the silicon nitride film $56_2$ shown in FIG. 8-3 is selectively removed in this step in the direction perpendicular to the cross section shown in the drawing, too. In other words, reference numerals $58_1$ and $58_2$ shown in FIG. 8-4 denote the remaining portions of the silicon nitride films $56_1$ and $56_2$ shown in FIG. 8-3, respectively. After the selective removal of the silicon nitride films, the exposed portions of the silicon oxide films $55_1$, $55_2$ and 53 are etched away by an etchant such as hydrofluoric acid or $NH_4F$. Incidentally, the silicon oxide film 53 may be selectively removed first, followed by selectively removing the silicon nitride films $56_1$, $56_2$ and, then, the underneath silicon oxide films $55_1$, $55_2$. By these operations, a gate oxide film $53_1$ is formed beneath the poly-Si film $54_1$ as shown in FIG. 8-4. On the other hand, a laminate of a silicon oxide film $57_1$, i.e., a remaining portion of the film $55_1$ shown in FIG. 8-3, and the silicon nitride film $58_1$ is formed on the poly-Si film $54_1$. Likewise, a laminate of a silicon oxide film $57_2$, i.e., a remaining portion of the film $55_2$ shown in FIG. 8-3, and the silicon nitride film $58_2$ is formed on the poly-Si film $54_2$. Further, the substrate surface is exposed on both sides of the gate oxide film $53_1$.

Then, an impurity of, for example, N-type is diffused into the substrate through the exposed surfaces thereof by an ordinary diffusion technique or ion implantation technique so as to form source and drain regions. After the impurity diffusion, the entire substrate is subjected to thermal oxidation so as to form a silicon oxide film 59 covering the exposed surfaces of the substrate and the exposed surfaces of the poly-Si films $54_1$ and $54_2$ as shown in FIG. 8-5. Then, the remaining silicon nitride films $58_1$, $58_2$ and the underneath silicon oxide films $57_1$, $57_2$ are removed so as to provide the contact-forming portion $60_1$, $60_2$ exposing the poly-Si films $54_1$, $54_2$, respectively (see FIG. 8-6). Incidentally, the silicon oxide films $57_1$, $57_2$ are sufficiently thinner than the silicon oxide film 59, rendering it possible to remove the films $57_1$, $57_2$ with major portion of the film 59 unremoved by controlling the etching time. Finally, a second poly-Si film is formed on the entired surface and, then, selectively removed so as to produce a desired transistor provided with a second poly-Si layer 61 connecting the poly-Si films $54_1$ and $54_2$ via the contact-forming portions $60_1$ and $60_2$ as shown in FIG. 8-6. Incidentally, the second poly-Si layer may be made to perform the function of a resistor or an active element.

FIG. 9 is a plan view of the field effect transistor shown in FIG. 8-6. As apparent from FIG. 9, the contact-forming portions $60_1$ and $60_2$ filled by the second poly-Si film 61 for connection to the first poly-Si films $54_1$ and $54_2$ are automatically positioned within the widths of the poly-Si films $54_1$ and $54_2$. It follows that room for dealing with deviation of mask-aligning need not be provided for bringing the second poly-Si film into contact with the first poly-Si films. Further, the second poly-Si film 61 is brought into contact with the first poly-Si film $54_1$ in the gate region, not above the field oxide film. The obvious conclusion is that this invention permits prominently enhancing the integration degree of semiconductor elements and degree of freedom in pattern and layout compared with the prior art shown in FIGS. 1 and 3.

Needless to say, the technical idea of this invention is not restricted to the embodiment described herein. It is possible to provide various modifications within the technical scope of this invention.

What is claimed is:

1. A method of producing a semiconductor device, comprising the steps of:
    (1) forming a silicon oxide film on one main surface of a silicon semiconductor substrate of one conductivity type;
    (2) selectively removing the silicon oxide film so as to provide openings partly exposing the surface of the substrate;
    (3) forming a poly-Si film of the opposite conductivity type on the entire surface of the substrate by the chemical vapor deposition method;
    (4) forming a silicon nitride film on the poly-Si film;
    (5) selectively removing the silicon nitride film and the poly-Si film successively in a manner to form a pattern of the electrodes and wiring layers;
    (6) removing the patterned silicon nitride film except the contact-forming portion in which a conductive layer is brought into contact with the underlying poly-Si film layer;
    (7) selectively removing the exposed portion of the silicon oxide film so as to provide openings through which an impurity is diffused into the substrate for forming source and drain regions, the unremoved portion of the silicon oxide film constituting a gate oxide film;
    (8) oxidizing the entire surface of the substrate so as to form a silicon oxide film covering the exposed portion of the substrate and the exposed portion of the poly-Si film;
    (9) removing the remaining silicon nitride film to form the contact-forming portion; and
    (10) forming the conductive layer in contact with the poly-Si film via the contact-forming portion.

2. The method according to claim 1, further comprising the steps of:
    forming a thin silicon oxide film between the poly-Si film and the silicon nitride film, and
    removing the thin silicon oxide film after removal of the silicon nitride film remaining on the poly-Si film.

3. The method according to claim 1, wherein the conductive layer consists of poly-Si, molybdenum silicide or aluminum.

* * * * *